(12) United States Patent
Dosunmu et al.

(10) Patent No.: US 8,330,171 B2
(45) Date of Patent: Dec. 11, 2012

(54) HIGH SPEED, WIDE OPTICAL BANDWIDTH, AND HIGH EFFICIENCY RESONANT CAVITY ENHANCED PHOTO-DETECTOR

(75) Inventors: Olufemi I. Dosunmu, Santa Clara, CA (US); Ansheng Liu, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 103 days.

(21) Appl. No.: 12/842,341

(22) Filed: Jul. 23, 2010

(65) Prior Publication Data

US 2012/0018744 A1  Jan. 26, 2012

(51) Int. Cl.
*H01L 29/16*   (2006.01)
(52) U.S. Cl. .................... 257/82; 257/E33.076; 219/638
(58) Field of Classification Search .................. 257/82, 257/E33.076
See application file for complete search history.

(56) References Cited

U.S. PATENT DOCUMENTS

| | | | |
|---|---|---|---|
| 5,767,507 A * | 6/1998 | Unlu et al. ................. | 369/120 |
| 7,501,303 B2 * | 3/2009 | Unlu et al. ................. | 438/57 |
| 7,683,397 B2 | 3/2010 | Sarid et al. | |
| 2003/0047752 A1 * | 3/2003 | Campbell et al. ............ | 257/186 |
| 2004/0149985 A1 | 8/2004 | Kim | |
| 2008/0121867 A1 * | 5/2008 | Yagyu et al. ................ | 257/21 |
| 2009/0179225 A1 | 7/2009 | Fertig et al. | |
| 2010/0019275 A1 | 1/2010 | Takeshi | |

FOREIGN PATENT DOCUMENTS

| | | |
|---|---|---|
| EP | 1796169 | 6/2007 |
| WO | WO-2006011766 | 2/2006 |

OTHER PUBLICATIONS

Int'l Search Report & Written Opinion mailed Jan. 4, 2012 for Int'l Patent Application No. PCT/US2011/043646.
Dosunmu, et al., "Germanium on Double-SOI Photodetectors for 1550 nm Operation", *Proceedings of SPIE: Semiconductor Photodetectors*, vol. 5353, Jan. 24-29, 2004, pp. 65-71.
Dosunmu, et al., "Germanium on Double-SOI Photodetectors for 1550 nm Operation", *Proceedings of IEEE Lasers and Electro-Optics Society 2003 Annual Meeting*, vol. 2, Oct. 29-30, 2003, pp. 853-854.

(Continued)

*Primary Examiner* — David Vu
*Assistant Examiner* — Brandon Fox
(74) *Attorney, Agent, or Firm* — Blakely, Sokoloff, Taylor & Zafman LLP

(57) ABSTRACT

A single optical receiver having a photo-detector with a wide optical bandwidth and high efficiency within the wide optical bandwidth, the photo-detector comprising: a first diode region of first doping type for receiving light; a second diode region of second doping type and of second thickness; an active region for converting the received light to an electronic signal, the active region having a third thickness and configured to reside between the first diode region and the second diode region; and a reflector coupled to the second diode region and having a silicon layer with a fourth thickness, the silicon layer residing between silicon oxide layers of fifth thicknesses, wherein the active region is configured to absorb the light of wavelengths of less than 900 nm, and wherein the reflector is configured to reflect the light of wavelengths from a range of 1260 nm to 1380 nm.

21 Claims, 4 Drawing Sheets

OTHER PUBLICATIONS

Dosunmu, et al., "High Speed Resonant Cavity Enhanced Ge Photodetectors on Reflecting Si Substrates for 1550 nm Operation", *IEEE Photonics Technology Letters,* vol. 17, No. 1, Jan. 2005, pp. 175-177.

Dosunmu, Olufemi I., et al., "High-Speed Resonant Cavity Enhanced Ge Photodetectors on Reflecting Si Substrates for 1550 nm Operation", *Proceedings of IEEE Lasers and Electro-Optics Society 2004 Annual Meeting,* Nov. 7-11, 2004, pp. 148-149.

Dosunmu, Olufemi I., et al., "Resonant Cavity Enhanced Ge Photodetectors for 1550 nm Operation on Reflecting Si Substrates", *IEEE Journal of Selected Topics in Quantum Electronics,* vol. 10, No. 4, Jul./Aug. 2004, pp. 694-701.

Emsley, et al., "High-Efficiency, 10 GHz Bandwidth Resonant-Cavity-Enhanced Silicon Photodetectors Operating at 850 nm Wavelength", *Proceedings of IEEE Lasers and Electro-Optics Society 2001 Annual Meeting,* vol. 2, Nov. 12-13, 2001, pp. 839-840.

Emsley, et al., "High-Speed Resonant-Cavity Enhanced Silicon Photodetectors on Reflecting Silicon-On-Insulator Substrates", *IEEE Photonics Technology Letters,* vol. 14, Apr. 2002, pp. 519-521.

Emsley, et al., "Realization of High-Efficiency 10 GHz Bandwidth Silicon Photodetector Arrays for Fully Integrated Optical Data Communication Interfaces", *Proceedings of the 33rd European Solid-State Device Research Conference,* Sep. 16-18, 2003, pp. 47-50.

Emsley, et al., "Silicon Resonant Cavity Enhanced 12X1 Photodetector Arrays for Optical Interconnect Receiver Integration", *Proceedings of IEEE Lasers and Electro-Optics Society 2003 Annual Meeting,* vol. 1, Oct. 27-28, 2003, pp. 67-68.

Emsley, et al., "Silicon Resonant Cavity Enhanced Photodetector Arrays for Optical Interconnects", *Proceedings of SPIE: Active and Passive Components for WDM Communications III,* vol. 5246, Sep. 8-11, 2003, pp. 409-421.

Emsley, et al., "Silicon Substrates With Buried Distributed Bragg Reflectors for Resonant Cavity-Enhanced Optoeletronics", *IEEE Journal of Selected Topics in Quantum Electronics,* vol. 8, Jul./Aug. 2002, pp. 948-955.

Euleu, M. S., et al., "High-Speed Si Resonant Cavity Enhanced Photodetectors and Arrays", *Journal of Vacuum Science and Technology A,* vol. 22, No. 3, May 14, 2004, pp. 781-787.

Gokkavas, et al., "High-Speed High-Efficiency Large-Area Resonant Cavity Enhanced p-i-n Photodiodes for Multimode Fiber Communications", *IEEE Photonics Technology Letters,* vol. 13, No. 12, Dec. 2001, pp. 1349-1351.

Gokkavas, et al., "Resonant Cavity Enhanced Photodiodes With a Broadened Spectral Peak", *Proceedings of IEEE Lasers and Electo-Optics Society 2001 Annual Meeting,* vol. 2, Nov. 12-13, 2001, pp. 768-769.

\* cited by examiner

HIGH SPEED, WIDE OPTICAL BANDWIDTH, AND HIGH EFFICIENCY RESONANT CAVITY ENHANCED PHOTO-DETECTOR

FIELD OF THE INVENTION

Embodiments of the invention relate generally to the field of photo-detectors. More particularly, embodiments of the invention relate to an apparatus and a system for a single photo-detector which has a wide optical bandwidth and high efficiency within the wide optical bandwidth.

BACKGROUND

As demand for high speed data transfers (e.g., 25 Gb/s per channel) is increasing, optical systems having photo-detectors are being used for receiving high speed data. Such photo-detectors are designed to operate efficiently in an optical receiver for a specific range of telecommunication wavelengths. For example, one set of photo-detectors are designed to detect incident light of short haul wavelengths (e.g., 850 nm). Another set of photo-detectors are designed to detect incident light of O-Band wavelengths (e.g., 1260 nm to 1380 nm). Another set of photo-detectors are designed to detect incident light of long haul wavelengths used for intercontinental communication (e.g., 1550 nm).

Therefore, depending on which frequency (or wavelength) range of incident light is being used for an optical system, a specific (or customized) optical receiver with a specific photo-detector is designed to operate to detect that range of wavelength of incident light. Hence, the customized optical receiver cannot be used for detecting a wide range of wavelengths of light while still providing data rate transfers of 25 Gb/s per channel e.g., for detecting wavelengths less than 900 nm and wavelengths in the range of 1260 nm to 1380 nm. Consequently, multiple customized receivers are used in optical systems to receive/detect a wide range of wavelengths of light thus potentially making the optical system costly.

BRIEF DESCRIPTION OF THE DRAWINGS

Embodiments of the invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Embodiments of the invention describe an apparatus and a system for a single optical receiver with one or more resonant cavity enhanced (RCE) photo-detectors having a wide optical bandwidth and high efficiency and configured to allow high data rates per channel.

The term high data rate per channel herein means data rates of around 25 Gb/s per channel. The term wide optical bandwidth herein refers to the ability to absorb light of wavelengths of less than 900 nm and wavelengths from a range of 1260 nm to 1380 nm.

In one embodiment, the thicknesses of the layers in the RCE photo-detector are configured to absorb the light of wavelengths of less than 900 nm and wavelengths from a range of 1260 nm to 1380 nm. In such an embodiment, a single optical receiver having the RCE photo-detector is able to operate for a wide range of wavelengths of incident light without the need for special/custom optical receivers to detect either light of wavelengths of less than 900 nm or wavelengths from a range of 1260 nm to 1380 nm while maintaining high data rates of around 25 Gb/s per channel.

In the following description, numerous details are discussed to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention. In the following description, the RCE photo-detector is interchangeably referred to as a photo-detector.

Figure 1:
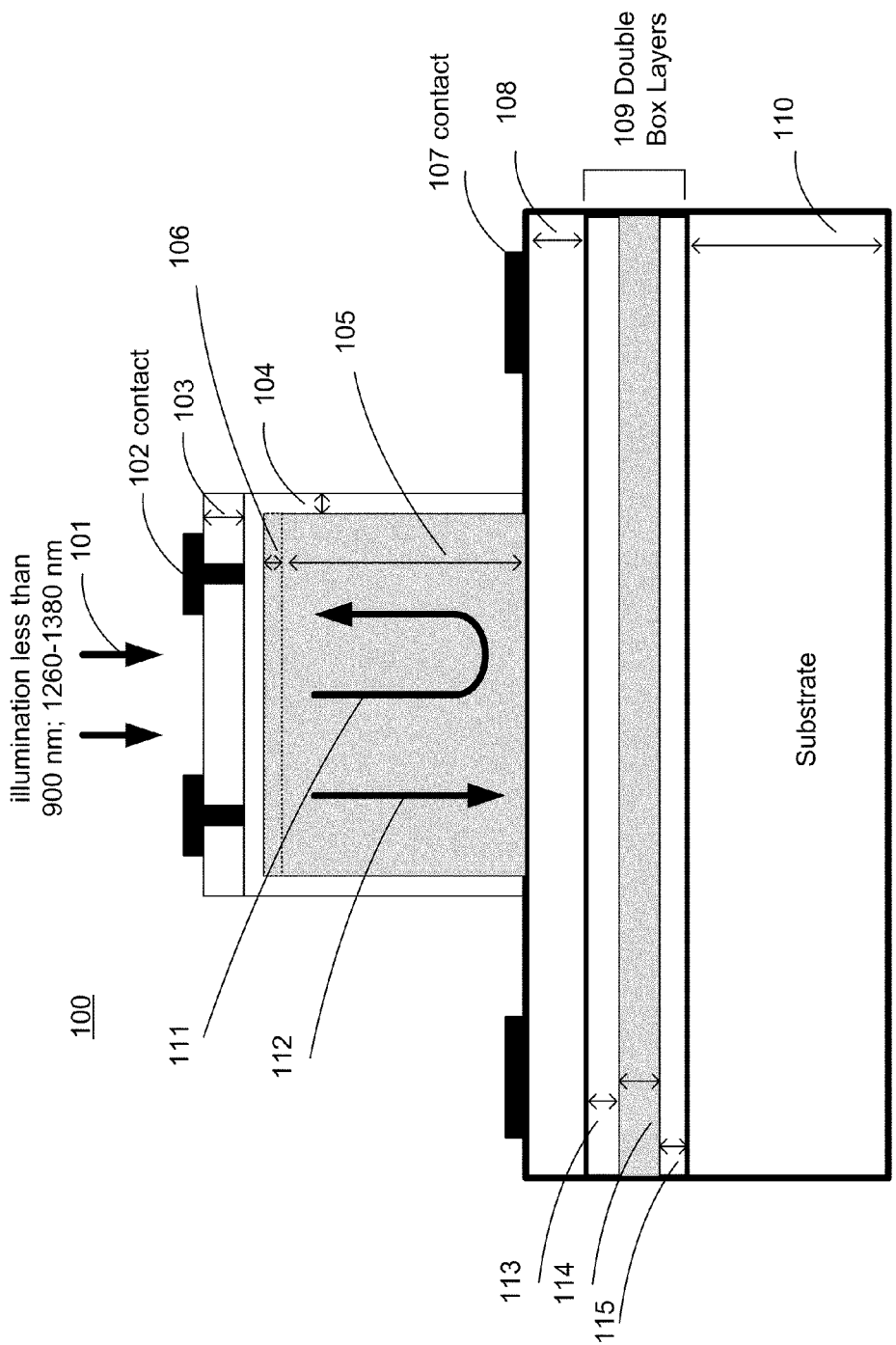
FIG. 1 illustrates a cross-section of a photo-detector operable to absorb light of wavelengths of less than 900 nm and wavelengths from a range of 1260 nm to 1380 nm, according to one embodiment of the invention.

FIG. 1 illustrates a cross-section of the photo-detector 100 which detects incident light 101, according to one embodiment of the invention. In one embodiment, the photo-detector 100 comprises a first diode region 106 of first doping type for receiving incident light 101. In one embodiment, the first diode region 106 is composed of Germanium (Ge) or Silicon (Si) where the first doping type is an N or a P doping type. In one embodiment, Phosphorus is used for N doping type while Boron is used for P doping type. In other embodiments, other chemicals (elements and/or compounds) may be used for generating an N type doping and a P type doping for Ge and Si.

The photo-detector 100 further comprises a second diode region 108 of the second doping type. In one embodiment the second diode region 108 is composed of Si and the second doping type is of opposite polarity from the first doping type of the first diode region. For example, if the first doping type is of N doping type then the second doping type is of P doping type and visa versa. In one embodiment, the thickness of the second diode region 108 is from a range of 529 nm to 551 nm. In one embodiment, the thickness of the second diode region 108 is 540 nm.

The photo-detector 100 further comprises an active region 105 for converting the received light to an electronic signal. In one embodiment, the active region 105 is configured to reside between the first diode region 106 and the second diode region 108. In one embodiment, the active region is composed of Ge. In one embodiment, the thickness of the active region 105 is from a range of 1078 nm to 1122 nm to absorb the light of wavelengths of less than 900 nm with high optical response. In one embodiment, the thickness of the active region 105 is 1100 nm to absorb the light of wavelengths of less than 900 nm with high optical response.

The term optical response herein is also known as quantum efficiency ($\eta$) and refers to a percentage of absorption of incident light by a photo-detector. The term high $\eta$ herein refers to 80% or more absorption of incident light by the photo-detector.

The arrow 112 in FIG. 1 represents the absorption of the light of wavelengths of less than 900 nm in a single pass i.e., with little to no reflection of incident light, nearly all (80% and more) incident light 101 is absorbed by the active region 105. In one embodiment, the thickness of the active region 105 is approximately half of the thickness used in a typical Ge based normal-incidence photo-detector which is designed to absorb light of 1310 nm wavelength.

A person skilled in the art would realize that electrons and holes are generated in the active region upon receiving incident light. These electrons/holes generate an electrical signal representing the incident light.

In one embodiment, a reflector 109 is coupled to the second diode region 108 and a substrate 110. In one embodiment, the reflector 109 comprises a double box layer of Si layer 114 sandwiched between Si oxide ($SiO_2$) layers 113 and 115 respectively. In one embodiment the Si layer 114 has a thickness of 276 nm to 288 nm while the $SiO_2$ layers 113 and 115 have thicknesses in the range of 223 nm to 233 nm. In one embodiment, the thickness of the Si layer 114 is 282 nm. In one embodiment, the thickness of the $SiO_2$ layer is 228 nm. In one embodiment, the thickness of the layers of the reflector 109 is configured to effectively increase the thickness of the Ge active region 105 (without actually increasing the thickness) by creating a multiple-pass optical path for the incident light 101. In such an embodiment, the thinner Ge active region 105—thinner than a typical photo-detector—leads to higher speed compared to a typical photo-detector while maintaining high quantum efficiency.

A person skilled in the art would realize that the thicker the active region, the higher the quantum efficiency and the slower the photo-detector. The opposite is true for thinner active regions. A thicker active region results in a slower photo-detector because the transit time for the photo-detector is longer.

The term transit time herein refers to the time the slowest carrier takes to travel from one end of the active region 105 to another end of the active region 105 i.e., the time it takes the slowest carrier in the active region 105 to reach the metal contact 107 once the active region 105 receives incident light 101.

As mentioned above, the embodiments of the invention achieve higher quantum efficiency with a thinner Ge active region 105, than a typical Ge active region, and thus achieve high transit times needed for data transfers of 25 Gb/s per channel.

In one embodiment, the reflector 109 is configured to reflect light of wavelengths from a range of 1260 nm to 1380 nm. This reflected light is shown by the arrow 111. In one embodiment, the light reflected by the reflector 109 is also partially reflected by an interface layer 103 causing a greater percentage of the incident of wavelengths 1260 nm to 1380 nm to be absorbed over multiple reflections within the active region 105. In one embodiment, the reflector 109 is a Double-Silicon-On-Insulator (DSOI) reflector. In another embodiment, the reflector 109 is a Distributed Bragg Reflector (DBR).

In one embodiment, the thickness of the Si layer 114 is an odd multiple of a quarter of a wavelength of light, normalized by the Si refractive index, while the thickness of the second diode region 108 does not have to be an odd multiple of a quarter of a wavelength of light as seen in typical DBR structures. In the embodiment of the invention, the thickness of the second diode region 108 is configured to maximize the quantum efficiency of the photo-detector 100 and is not a multiple of a quarter of a wavelength of light. In such an embodiment, the overall quantum efficiency of this resonant cavity photo-detector 100 is higher over the broad 1260 nm to 1380 nm wavelength range than for a typical resonant cavity photo-detector.

As mentioned above, the photo-detector 100 further comprises an interface layer 103 having an anti-reflective-coating (ARC) and coupled to a passivation layer 104. In one embodiment, the passivation layer 104 surrounds a portion of the active region 105 and the first diode region 106. In one embodiment, the ARC is composed of silicon nitride ($Si_3N_4$). In another embodiment, the ARC is composed of silicon oxide ($SiO_2$). In one embodiment, the thickness of the interface layer 103 having ARC composed of $Si_3N_4$ is from a range of 500 nm to 521 nm. In one embodiment, the thickness of the ARC layer composed of $Si_3N_4$ is 511 nm.

In one embodiment, the portion of the passivation layer 104 which couples to both the interface layer 103 and the first diode region 106 is of the first doping type. In one embodiment, the passivation layer 104 is composed of Si. In one embodiment, the passivation layer 104 is composed of amorphous silicon. In another embodiment, the passivation layer 104 is composed of poly silicon. The thickness of the passivation layer 104 is of such value that it maximizes the device optical/light absorption while helping to suppress dark currents. In one embodiment, the thickness of the passivation layer 104 is either less than 30 nm or from a range of 184 nm to 192 nm. In one embodiment, the thickness of the passivation layer 104 is 188 nm. The photo-detector 100 further comprises a substrate 110 that is composed of high resistance Si. In one embodiment, the high resistivity of the substrate is approximately 100 ohm-cm which minimizes parasitic effects that can adversely affect the photo-detector's speed.

The electric current generated by the incident light is collected via electrical contacts 102 and 107, according to one embodiment of the invention. In one embodiment, contact 102 is coupled to the first diode region while contact 107 is coupled to the second diode region.

Figure 2:
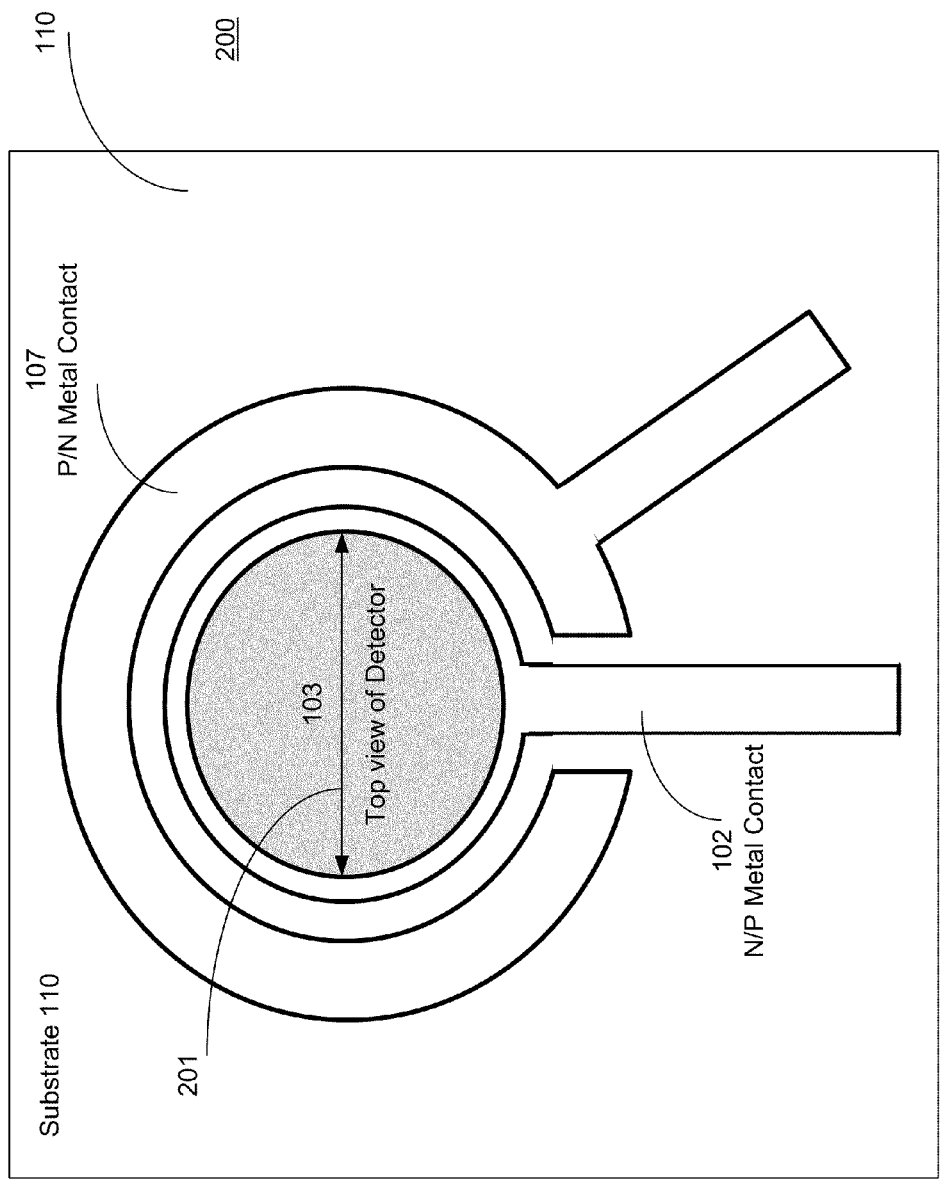
FIG. 2 illustrates a top view of the photo-detector of FIG. 1, according to one embodiment of the invention.

FIG. 2 illustrates a top view 200 of the photo-detector 100 of FIG. 1, according to one embodiment of the invention. FIG. 2 is described with reference to FIG. 1. The circle 103 in the center of the top view 200 is the interface layer 103 of the photo-detector 100. Metal contacts 102 and 107 provide electrical connections to the photo-detector 100 to carry current generated by the photo-detector 100 from the incident light 101. The circle 103 is of diameter 201 that indicates the size of the photo-detector. In one embodiment, the diameter 201 of the photo-detector is 30 µm or less. A larger diameter means a bigger interface to receive incident light.

Figure 3:
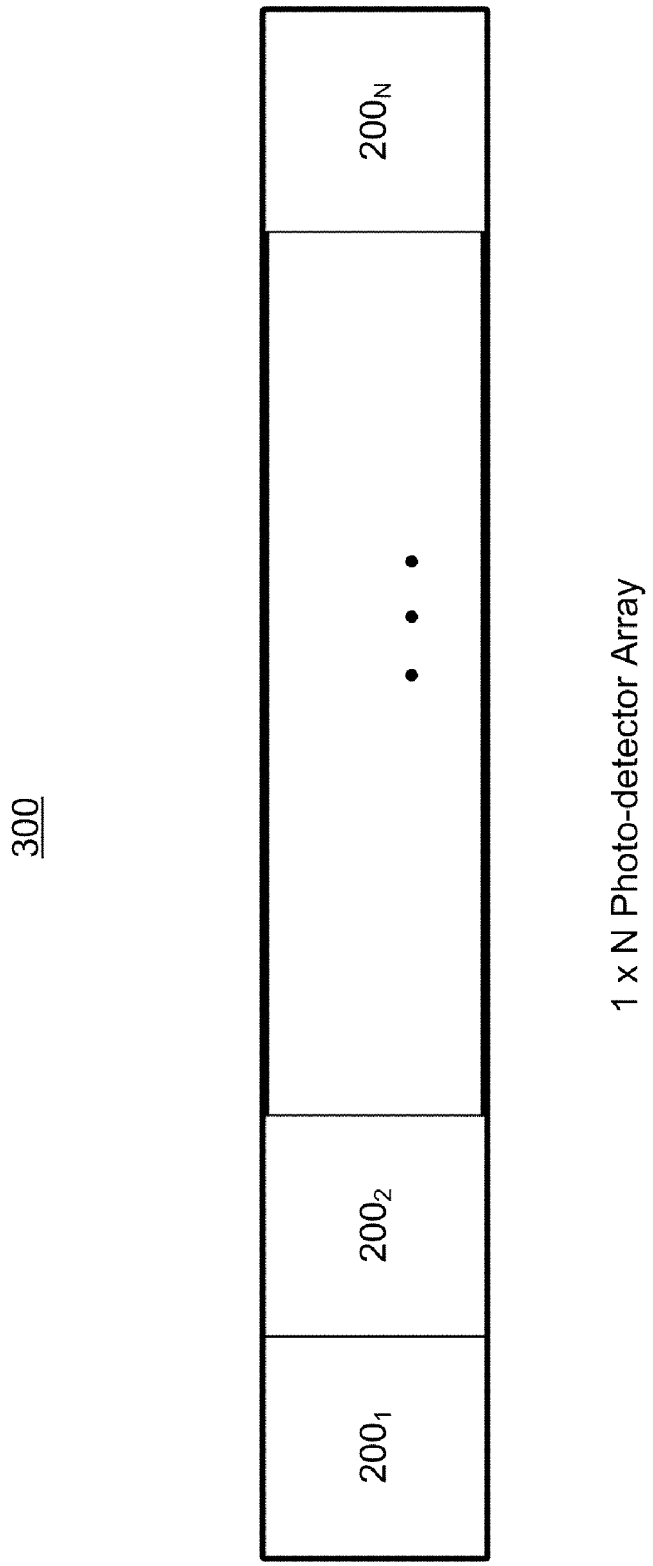
FIG. 3 illustrates an array of photo-detectors based on the photo-detectors of FIG. 1 and FIG. 2, according to one embodiment of the invention.

FIG. 3 illustrates an array 300 of photo-detectors $200_{1-N}$ based on the photo-detectors of FIG. 1 and FIG. 2, according to one embodiment of the invention. In one embodiment, N is 2. In another embodiment, N is 6. In other embodiments, N can be different number other than 2 and 6. In one embodiment, the array 300 resides in an optical receiver shown in FIG. 4.

Figure 4:
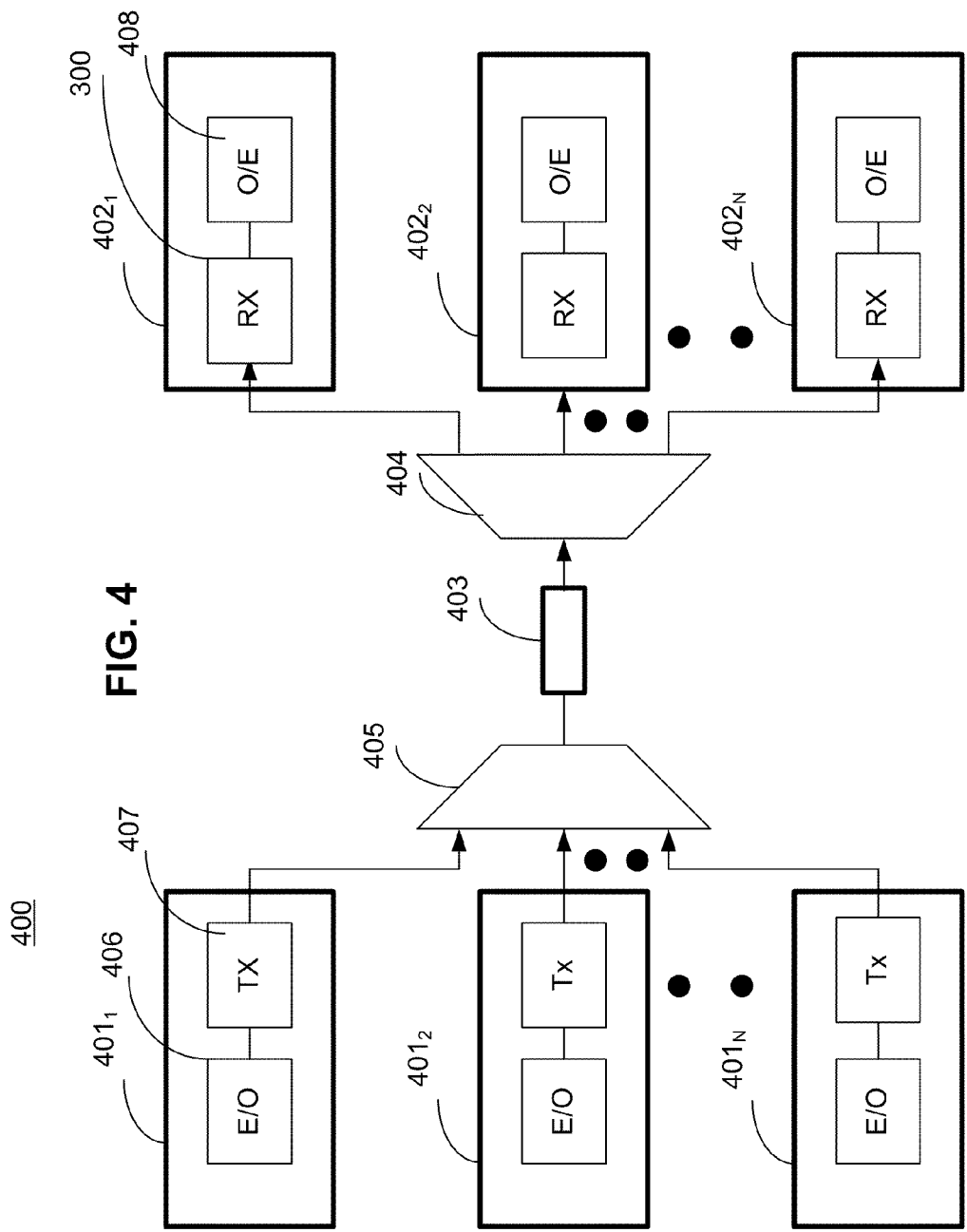
FIG. 4 illustrates an optical system having the photo-detectors of FIG. 1 in optical receivers, according to one embodiment of the invention.

FIG. 4 illustrates an optical system 400 having the photo-detectors of FIG. 1 in optical receivers 300, according to one embodiment of the invention. In one embodiment, the system 400 comprises one or more optical transmitters $401_{1-N}$. Each optical transmitter from the optical transmitters $401_{1-N}$ comprises an electrical to optical conversion unit 406 coupled to a transmitter 407. In one embodiment, the transmitter 407 transmits an optical signal having a wavelength of less than 900 nm or wavelengths from a range of 1260 nm to 1380 nm to the optical receivers $402_{1-N}$ via multiplexer 405, optical waveguide 403, and de-multiplexer 404.

In one embodiment, each optical receiver from among the optical receivers $402_{1-N}$ comprises a receiver 300 coupled to an optical to electrical conversion unit 408. In one embodiment, the receiver 300 comprises an array 300 of photo-detectors. In one embodiment, the de-multiplexer 404 couples an optical transmitter from among the optical transmitters $401_{1-N}$ to a corresponding optical receiver from among the optical receivers $402_{1-N}$. In one embodiment, the optical waveguide is an optical Universal Serial Bus (USB) cable. In one embodiment, the optical transmitters $401_{1-N}$ and receivers $401_{1-N}$ reside in their respective computer systems (not shown).

In one embodiment, each transmitter 407 transmits a narrow-band optical signal centered at a specific wavelength to the optical receivers $402_{1-N}$. Traditionally, a customized receiver is needed to receive/absorb light centered at that specific wavelength transmitted by the transmitter. However, in the embodiments discussed herein, the receiver 300 is configured to absorb a wide range of wavelengths i.e., wavelength of less than 900 nm and wavelengths from a range of 1260 nm to 1380 nm, and so customized receivers are no longer needed.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

While the invention has been described in conjunction with specific embodiments thereof, many alternatives, modifications and variations of such embodiments will be apparent to those of ordinary skill in the art in light of the foregoing description. The embodiments of the invention are intended to embrace all such alternatives, modifications, and variations as to fall within the broad scope of the appended claims.

We claim:

1. A photo-detector comprising:
    a first diode region of first doping type for receiving light;
    a second diode region of second doping type and of second thickness;
    an active region for converting the received light to an electronic signal, the active region having a third thickness and configured to reside between the first diode region and the second diode region;
    a reflector coupled to the second diode region and having a silicon layer with a fourth thickness, the silicon layer residing between silicon oxide layers of fifth thickness, wherein the third thickness of the active region is configured to absorb light of wavelengths of less than 900 nm, and wherein the forth and the fifth thicknesses of the reflector are configured to reflect light of wavelengths from a range of 1260 nm to 1380 nm;
    a passivation layer of sixth thickness surrounding a portion of the active region and the first diode region; and
    an interface layer having an anti-reflective-coating (ARC) of first thickness and coupled to the passivation layer, wherein a portion of the passivation layer is of the first doping type and is coupled to the interface layer.

2. The photo-detector of claim 1, wherein the passivation layer includes silicon.

3. The photo-detector of claim 1, wherein:
    the first thickness is from a range of 500 nm to 521 nm, and the sixth thickness is from a range of 184 nm to 192 nm.

4. The photo-detector of claim 1, wherein the fifth thickness is an odd multiple of a quarter of a wavelength of light normalized by the refractive index of silicon-oxide ($SiO_2$).

5. The photo-detector of claim 1, wherein:
    the second thickness is from a range of 529 nm to 551 nm,
    the third thickness is from a range of 1078 nm to 1122 nm,
    the fourth thickness is from a range of 276 nm to 288 nm, and
    the fifth thickness is from a range of 223 nm to 233 nm.

6. The photo-detector of claim 1 further comprising electrical contacts coupled to the first diode region and the second diode region, the electrical contacts for providing the electronic signal generated from the received light.

7. The photo-detector of claim 1, wherein the first diode region includes germanium, wherein the second diode region includes silicon, and wherein the first and the second doping types are of opposite polarities, one of an N-doping type doping and the other of a P-doping type doping.

8. The photo-detector of claim 1, wherein the reflector is a Double-Silicon-On-Insulator (DSOI) reflector.

9. The photo-detector of claim 1, wherein the reflector is a Distributed Bragg Reflector (DBR).

10. A system comprising:
    a transmitter to transmit an optical signal over an optical waveguide; and
    a receiver to receive the optical signal and having a photo-detector comprising:
        a first diode region of first doping type;
        a second diode region of second doping type and of second thickness;
        an active region for converting the received optical signal to an electronic signal, the active region having a third thickness and configured to reside between the first diode region and the second diode region;
        a reflector coupled to the second diode region and having a silicon layer with a fourth thickness, the silicon layer residing between silicon oxide layers of fifth thickness, wherein the third thickness of the active region is configured to absorb light of wavelengths of less than 900 nm, and wherein the forth and the fifth thicknesses of the reflector are configured to reflect light of wavelengths from a range of 1260 nm to 1380 nm;
        a passivation layer of sixth thickness surrounding a portion of the active region and the first diode region; and
        an interface layer having an anti-reflective-coating (ARC) of first thickness and coupled to the passivation layer, wherein a portion of the passivation layer is of the first doping type and is coupled to the interface layer.

11. The system of claim 10, wherein the passivation layer includes silicon.

12. The system of claim 10, wherein:
    the first thickness is from a range of 500 nm to 521 nm, and
    the sixth thickness is from a range of 184 nm to 192 nm.

13. The system of claim 10, wherein the fifth thickness is an odd multiple of a quarter of a wavelength of light normalized by the refractive index of Silicon-oxide ($SiO_2$).

14. The system of claim 10, wherein:
    the second thickness is from a range of 529 nm to 551 nm,
    the third thickness is from a range of 1078 nm to 1122 nm,
    the fourth thickness is from a range of 276 nm to 288 nm, and
    the fifth thickness is from a range of 223 nm to 233 nm.

15. The system of claim 10 further comprising electrical contacts coupled to the first diode region and the second diode region, wherein the electrical contacts for providing the electronic signal being generated from the received light.

16. The system of claim 10, wherein the first diode region includes germanium, wherein the second diode region includes silicon, and wherein the first and the second doping types are of opposite polarities, one of an N-doping type doping and the other of a P-doping type doping.

17. The system of claim 10, wherein the reflector is a Double-Silicon-On-Insulator (DSOI) reflector.

18. The system of claim 10, wherein the photo-detector is an array of photo-detectors.

19. A photo-detector comprising:
a first diode region of first doping type for receiving light;
a second diode region of second doping type and of second thickness;
an active region for converting the received light to an electronic signal, the active region having a third thickness and configured to reside between the first diode region and the second diode region;
a reflector coupled to the second diode region and having a silicon layer with a fourth thickness, the silicon layer residing between silicon oxide layers of fifth thickness, wherein the third thickness of the active region is configured to absorb light of wavelengths of less than 900 nm, and wherein the forth and the fifth thicknesses of the reflector are configured to reflect light of wavelengths higher than 900 nm, and wherein: the second thickness is from a range of 529 nm to 551 nm, the third thickness is from a range of 1078 nm to 1122 nm, the fourth thickness is from a range of 276 nm to 288 nm, and the fifth thicknesses are from a range of 223 nm to 233 nm.

20. The photo-detector of claim 19 further comprises:
a passivation layer of sixth thickness surrounding a portion of the active region and the first diode region; and
an interface layer having an anti-reflective-coating (ARC) of first thickness and coupled to the passivation layer, wherein a portion of the passivation layer is of the first doping type and is coupled to the interface layer.

21. A photo-detector comprising:
a first diode region of first doping type for receiving light;
a second diode region of second doping type and of second thickness;
an active region for converting the received light to an electronic signal, the active region having a third thickness and configured to reside between the first diode region and the second diode region;
a passivation layer of sixth thickness surrounding a portion of the active region and the first diode region; and
an interface layer having an anti-reflective-coating (ARC) of first thickness and coupled to the passivation layer, wherein a portion of the passivation layer is of the first doping type and is coupled to the interface layer.

* * * * *

UNITED STATES PATENT AND TRADEMARK OFFICE
CERTIFICATE OF CORRECTION

| | |
|---|---|
| PATENT NO. | : 8,330,171 B2 |
| APPLICATION NO. | : 12/842341 |
| DATED | : December 11, 2012 |
| INVENTOR(S) | : Dosunmu et al. |

It is certified that error appears in the above-identified patent and that said Letters Patent is hereby corrected as shown below:

In the Specification

Please insert in column 1, line 5 before FIELD OF THE INVENTION:

--STATEMENT OF GOVERNMENT INTEREST

This invention was made with Government support under contract number H98230-08-3-0011 awarded by the Department of Defense. The Government has certain rights in this invention.--

Signed and Sealed this
First Day of December, 2015

Michelle K. Lee
*Director of the United States Patent and Trademark Office*